United States Patent
Nishide et al.

(10) Patent No.: US 6,588,097 B2
(45) Date of Patent: Jul. 8, 2003

(54) METHOD OF MANUFACTURING MULTILAYERED CERAMIC SUBSTRATE AND GREEN CERAMIC LAMINATE

(75) Inventors: Mitsuyoshi Nishide, Yasu-gun (JP); Akira Baba, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 09/941,889

(22) Filed: Aug. 28, 2001

(65) Prior Publication Data

US 2002/0061629 A1 May 23, 2002

(30) Foreign Application Priority Data

Sep. 19, 2000 (JP) ........................................ 2000-283313

(51) Int. Cl.⁷ .................................................. H05K 3/30
(52) U.S. Cl. ........................................................ 29/832
(58) Field of Search ........................ 29/825, 830, 851, 29/832; 156/89.16

(56) References Cited

U.S. PATENT DOCUMENTS

| | | | |
|---|---|---|---|
| 3,770,529 A | * | 11/1973 | Anderson |
| 4,109,377 A | * | 8/1978 | Blazick et al. |
| 5,102,720 A | | 4/1992 | Raj |
| RE34,887 E | * | 3/1995 | Usifusa et al. |
| 5,855,711 A | * | 1/1999 | Araki et al. |
| 5,896,650 A | * | 4/1999 | Nishide et al. |
| 6,143,116 A | * | 11/2000 | Hayash et al. |

FOREIGN PATENT DOCUMENTS

JP            2000-025157             1/2000

* cited by examiner

*Primary Examiner*—Carl J. Arbes
(74) *Attorney, Agent, or Firm*—Dickstein, Shapiro, Morin & Oshinsky, LLP.

(57) ABSTRACT

The present invention provides a multilayered ceramic substrate having high precision and high reliability in which firing shrinkage in the planar direction thereof is suppressed and densification is achieved. The multilayered ceramic substrate is manufactured by laminating base layers each composed of a non-glass type low-temperature sintering ceramic raw material powder as a main component, and shrinkage inhibiting layers each composed of a sintering-resistant powder of alumina or the like as a main component to form a green ceramic laminate, and then firing the green ceramic laminate at the sintering temperature of the low-temperature sintering ceramic raw material powder. The shrinkage inhibiting layers contain a powder which does not soften and flow at the firing shrinkage start temperature of the low-temperature sintering ceramic powder, but permeates into the spaces of the sintering-resistant powder due to softening and flowing to densify the shrinkage inhibiting layers before sintering is completed.

13 Claims, 2 Drawing Sheets

METHOD OF MANUFACTURING MULTILAYERED CERAMIC SUBSTRATE AND GREEN CERAMIC LAMINATE

BACKGROUND OF THE INVENTION

1. Field of the Invention

The present invention relates to a method of manufacturing a multilayered ceramic substrate suitable for mounting semiconductor devices, and a green ceramic laminate used in the manufacturing process.

2. Description of the Related Art

An electronic device such as a mobile radio communication terminal unit or the like has recently been required to have a smaller size and higher functions, and a circuit board on which various mounted components such as semiconductor devices are mounted has been required to have a smaller size and higher reliability. In order to comply with these demands, a multilayered ceramic substrate comprising a laminate of a plurality of ceramic base layers is effective. This is because the multilayered ceramic substrate permits high-density wiring, thinning of layers, an increase in frequency, etc. The multilayered ceramic substrate is generally manufactured through a firing step, but the green ceramic body composed of a ceramic raw material powder as a main component undergoes a sintering shrinkage of about 10 to 20%, and thus causes a variation of about ±0.5% in dimensional precision.

In consideration of the above situation, the applicant of the present invention proposed a method in Japanese Unexamined Patent Publication No. 2000-25157, in which shrinkage-inhibiting layers composed of an alumina powder, as a main component, which is substantially not sintered at the sintering temperature of the ceramic raw material powder, i.e., which is substantially not sintered at the sintering temperature of base layers, are sandwiched between a plurality of ceramic green sheets composed of the ceramic raw material powder and a glass powder as main components, and the resultant laminate is fired at the sintering temperature of the base layers.

In this method, the shrinkage-inhibiting layers inhibit firing shrinkage of the base layers in the planar direction, and the glass component of the base layers permeates into the shrinkage-inhibiting layers and densifies the shrinkage-inhibiting layers, thereby eliminating the need to remove the shrinkage-inhibiting layers after firing. Therefore, a high-precision multilayered ceramic substrate can be manufactured.

In order to improve the function and characteristics of a multilayered ceramic substrate, attempts have recently been made to laminate different types of base materials layers, such as dielectric layers and magnetic layers, and laminate insulating layers having different thicknesses. The force of constraint required for the shrinkage-inhibiting layers, i.e., the type and thickness of the shrinkage-inhibiting layers required for sufficiently inhibiting firing shrinkage in the planar direction of the substrate, depends upon the type and thickness of the base layers. For example, in order to apply sufficient force of constraint to a thick base layer, a shrinkage-inhibiting layer (for example, a thick shrinkage-inhibiting layer) having sufficient force of constraint is required.

In order to achieve a higher-density multilayered ceramic substrate, it is necessary to form, with a high density, not only a circuit pattern of built-in elements such as a capacitor, an inductor and the like, but also a circuit pattern for connecting respective built-in elements or a built-in element and a mounted component. However, in order to form various circuit patterns in the multilayered ceramic substrate, the circuit patterns of the respective base layers generally have different densities (electrode densities). Therefore, since firing shrinkage easily proceeds in a portion having a low electrode density, a large force of constraint is required for applying sufficient constraint to a base layer having a low electrode density.

In the method disclosed in Japanese Unexamined Patent Publication Application No. 2000-25157, the shrinkage-inhibiting layers are densified by permeation of the glass component from the base materials layers, thereby causing difficulties in sufficiently densifying the shrinkage-inhibiting layers when the shrinkage-inhibiting layers are thick or the base layers contain small amounts of glass component. Consequently, it is difficult to realize a multilayered ceramic substrate having excellent reliability of strength and stability.

When the base layers contain large amounts of glass component and the shrinkage-inhibiting layers are relatively thin, the above method can sufficiently achieve densification of the shrinkage-inhibiting layers, but when the base layers contain small amounts of glass component and the shrinkage-inhibiting layers are thick, it is difficult to density the shrinkage-inhibiting layers because the permeation distance of the glass component from the base layers to the shrinkage-inhibiting layers is limited.

SUMMARY OF THE INVENTION

The present invention has been achieved for solving the above problem, and an object of the present invention is to provide a high-precision, high-reliability multilayered ceramic substrate manufactured by firing a laminate of base layers and shrinkage-inhibiting layers at the sintering temperature of the base layers in which firing shrinkage in the planar direction of the substrate is suppressed and densification of the shrinkage-inhibiting layers is achieved.

In order to achieve the object, the present invention provides a method of manufacturing a multilayered ceramic substrate comprising the step of laminating a base layer composed of a ceramic raw material powder as a main component and a shrinkage-inhibiting layer composed of a sintering-resistant powder, which is substantially not sintered at the sintering temperature of the ceramic raw material powder as a main component, for suppressing firing shrinkage of the base layer, and the step of firing the resultant laminate at the sintering temperature of the ceramic raw material powder, wherein the shrinkage-inhibiting layer contains a softening fluid powder which can densify the shrinkage-inhibiting layer due to softening and flowing accompanying firing.

In the method of manufacturing a multilayered ceramic substrate of the present invention, the shrinkage-inhibiting layer contains the softening fluid powder that softens and flows during firing to densify the shrinkage-inhibiting layer due to softening and flowing accompanying firing. Therefore, particularly when the shrinkage-inhibiting layer is thick and the base layer contains a small amount of glass component, firing shrinkage in the planar direction of the substrate can be sufficiently suppressed, and at the same time, sufficient densification of the shrinkage-inhibiting layer can be achieved to obtain a multilayered ceramic substrate with high precision and high reliability.

The present invention also provides a green ceramic laminate as a manufacturing intermediate in the method of manufacturing a multilayered ceramic substrate of the present invention. The laminate comprises a base layer composed of a ceramic raw material powder as a main component, and a shrinkage-inhibiting layer composed of a sintering-resistant powder, which is substantially not sintered at the sintering temperature of the ceramic raw material powder, for suppressing firing shrinkage of the base layer, as a main component wherein the shrinkage-inhibiting layer contains a softening fluid powder which can densify the shrinkage-inhibiting layer due to softening and flowing accompanying firing.

DESCRIPTION OF THE PREFERRED EMBODIMENTS

Figure 1:
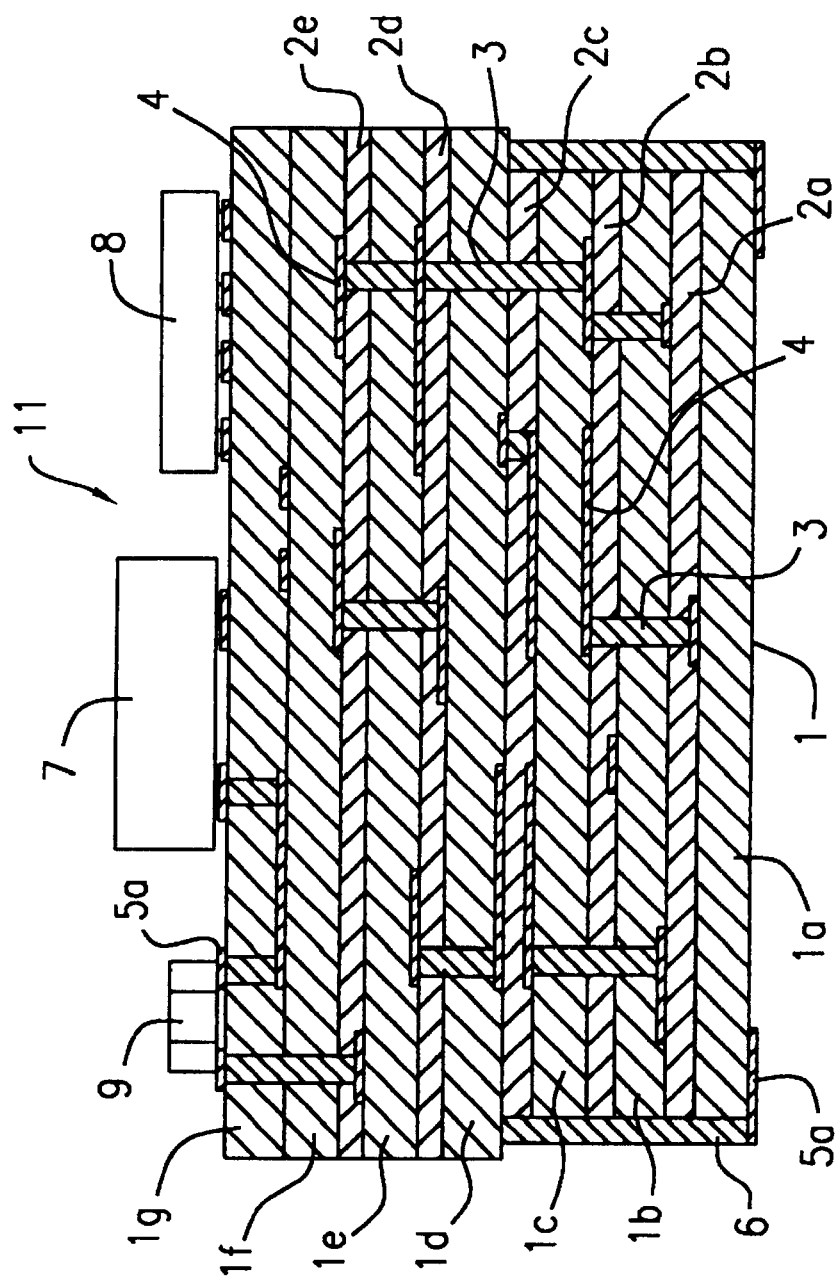
FIG. 1 is a schematic sectional view of a multilayered ceramic substrate according to the present invention.

In the method of manufacturing a multilayered ceramic substrate of the present invention, the softening fluid powder contained in a shrinkage-inhibiting layer is preferably a powder which substantially does not soften and flow at the firing shrinkage start temperature of a ceramic raw material powder contained in a base layer, and which fills the spaces of the sintering-resistant powder due to softening and flowing to densify the shrinkage-inhibiting layer at the time of completion of sintering of the ceramic raw material powder. In other words, the softening fluid powder does not decrease in viscosity and effectively does not function as a sintering auxiliary for the shrinkage-inhibiting layer, but the softening fluid powder permeates into the shrinkage-inhibiting layer comprising the sintering-resistant power in a porous state to fill the spaces between the particles of the sintering-resistant powder until sintering of the base layer is completed, thereby densifying the shrinkage-inhibiting layer. However, it may not be possible to completely avoid some degree of sintering auxiliary function. The softening fluid powder can densify the shrinkage-inhibiting layer due to softening and flowing accompanying firing. However, when the softening fluid powder starts to soften and flow at the firing shrinkage start temperature of the ceramic raw material powder, the softening fluid powder functions as the sintering auxiliary of the sintering-resistant powder to cause firing shrinkage of the shrinkage-inhibiting layer itself.

Furthermore, the softening fluid powder has a viscosity of about $10^{6.7}$ Pa·s or less until firing is completed. Namely, when the viscosity of the softening fluid powder decreases to about $10^{6.7}$ Pa·s or less in a firing cycle, particularly immediately before completion of sintering of the base layer, the softening fluid powder sufficiently permeates into the spaces in the sintering resistant powder in the shrinkage-inhibiting layer to sufficiently density the shrinkage-inhibiting layer. If the viscosity of the softening fluid powder excessively decreases in the firing cycle, the powder flows out in some cases, and thus the lower limit of the viscosity is preferably about $10^2$ Pa·s.

In the method of manufacturing a multilayered ceramic substrate of the present invention, the content of the softening fluid powder is preferably about 60% by volume or less, more preferably about 45% by volume or less, relative to the total amount of the sintering-resistant powder and the softening fluid powder. With the content of the softening fluid powder of about 60% by volume or less, the softening fluid powder functions less as a sintering auxiliary for the sintering-resistant powder, but the shrinkage-inhibiting layer exhibits sufficient force of constraint, thereby obtaining a multilayered ceramic substrate with high precision.

The softening fluid powder may comprise an oxide powder that produces a liquid phase at the sintering temperature or less. As the temperature is raised to effect sintering, the softening fluid powder preferably does not produce a liquid phase at the sintering shrinkage start temperature of the ceramic, but produces a liquid phase before sintering is completed, filling the spaces of the sintering-resistant powder to densify the shrinkage-inhibiting layer. Examples of such an oxide powder include a mixed powder of barium oxide and boron oxide, a mixed powder of manganese oxide and boron oxide, and the like.

The softening fluid powder is particularly preferably a glass powder containing at least one inorganic oxide selected from $SiO_2$, $B_2O_3$, $GeO_2$, $ZrO_2$, $Al_2O_3$, $P_2O_3$ and $V_2O_3$. Each of these oxides functions as a network forming oxide of the glass component. The shrinkage-inhibiting layer is sufficiently densified due to softening and flowing of the glass powder contained in the shrinkage-inhibiting layer. Particularly, when a glass powder is used as the softening fluid powder, the softening point (glass softening point) thereof is preferably about 500° C. or more. With the glass powder having a softening point of about 500° C. or more, firing shrinkage in the planar direction of the substrate can be sufficiently suppressed, and densification of the shrinkage-inhibiting layer can be sufficiently achieved.

Also, the softening fluid powder preferably has an average particle diameter of about 5 μm or less. Since the softening fluid powder having an average particle diameter of about 5 μm or less does not function much as a sintering auxiliary of the sintering-resistant powder, the shrinkage-inhibiting layer can sufficiently exhibit a force of constraint to obtain a multilayered ceramic substrate having excellent dimensional precision in the planar direction.

In the method of manufacturing a multilayered ceramic substrate of the present invention, the thickness of the base layer is preferably sufficiently larger than that of the shrinkage-inhibiting layer, and particularly preferably 0.5 to 50 μm. With the shrinkage-inhibiting layer having a thickness in this range, the force of constraint for the base layer can be sufficiently exhibited, and densification of the shrinkage-inhibiting layer can be sufficiently achieved. The thickness of the base layer is preferably equal to or more than three times, more preferably five times, of that of the shrinkage-inhibiting layer.

In the method of manufacturing a multilayered ceramic substrate of the present invention, the ceramic raw material powder contained in the base layer is preferably a low-temperature sintering ceramic raw material powder. The low-temperature sintering ceramic raw material powder can be fired at the same time as low-resistance Ag and Cu to realize a multilayered ceramic substrate having excellent radio-frequency characteristics. Since the low-temperature sintering ceramic raw material powder generally has a sintering temperature of about 800 to 1000° C., an amorphous glass powder having a softening point of 700 to 800° C., a crystallized glass powder that increases in viscosity due to crystal precipitation at 800° C. or more after densification of the shrinkage-inhibiting layer, an oxide powder that can produce a liquid phase at 800 to 1000° C. before sintering is completed, or the like can be used as the softening fluid powder.

Furthermore, the low-temperature sintering ceramic raw material powder is preferably a non-glass type low-temperature sintering ceramic raw material powder. In the method of manufacturing a multilayered ceramic substrate of the present invention, even when the raw material substantially does not contain a glass powder, like the non-glass type low-temperature sintering ceramic raw material powder, the shrinkage-inhibiting layer can be sufficiently densified.

In the method of manufacturing a multilayered ceramic substrate of the present invention, either via holes or conductor patters, or both, may be formed in the base layer or the shrinkage-inhibiting layer. When the base layer is composed of the low-temperature sintering ceramic raw material power as a main component, a metal or alloy containing at least one element selected from the group consisting of Ag, Au, Cu, Pd, W and Ni, which have excellent radio-frequency characteristics, can be selected as a main construction material of the via holes or conductor patterns.

In the method of manufacturing a multilayered ceramic substrate of the present invention, if required, mounted components such as semiconductor devices, chip capacitors, etc. are mounted after the green ceramic laminate is fired. Thus, the method of manufacturing a multilayered ceramic substrate of the present invention can also be applied to a ceramic multilayer module, or the like, in which various mounted components are mounted on a multilayered ceramic substrate.

A multilayered ceramic substrate and a ceramic multilayer module according to a preferred embodiment of the present invention will be described below.

The ceramic multilayer module 11 shown in FIG. 1 comprises a multilayered ceramic substrate 1 comprising base layers 1a, 1b, 1c, 1d, 1e, 1f and 1g, which are made of ceramic such as low-temperature sintering ceramic or the like, and shrinkage-inhibiting layers 2a, 2b, 2c, 2d and 2e, which are composed of a sintering-resistant powder densified by softening and flowing of a softening fluid powder, the base layers and the shrinkage-inhibiting layers being laminated in turn. Furthermore, mounted components such as a semiconductor devices 7 and 8, a chip capacitor 9, etc. are mounted on one of the main surfaces of the multilayered ceramic substrate 1.

Furthermore, via holes 3 for connecting conductor patterns formed on upper and lower layers, capacitors and inductors are formed in the multilayered ceramic substrate 1, and internal conductor patterns 4 are also formed in the multilayered ceramic substrate 1, for connecting the respective internal elements or the internal elements and the mounted components. Furthermore, a surface conductor pattern 5a is formed on one of the main surfaces to form lands and pads for connecting the mounted components, and surface conductor patterns 5b and 6 are formed on the other main surface and the side, respectively, to form an external terminal and I/O terminal for connection with a mother board or the like.

The shrinkage-inhibiting layers 2a, 2b, 2c, 2d and 2e are sufficiently densified due to permeation of the softening fluid powder contained therein. However, densification of each of the shrinkage-inhibiting layers includes not only densification by the softening fluid powder but also densification due to flowing and diffusion of, for example, the glass component contained in the base layers or a component contained in the base layers which producing glass by firing.

An example of the method of manufacturing the ceramic multilayer module 11 will be described.

First, for example, barium oxide, silicon oxide, alumina, calcium oxide and boron oxide are mixed to prepare a non-glass type low-temperature sintering ceramic raw material powder as a ceramic raw material powder which constitutes the base layers. Then, an organic binder such as polyvinyl butyral or the like, a plasticizer such as di-n-butyl phthalate or the like, a solvent such as toluene, isopropyl alcohol or the like are added to the low-temperature sintering ceramic raw material powder, followed by mixing to prepare a base layer slurry. Then, the thus-prepared base layer slurry is formed in a sheet on a carrier film by a doctor blade method to form a base layer (ceramic green sheet).

The low-temperature sintering ceramic raw material powder is a ceramic raw material powder which can be fired, particularly, at about 1000° C. or less, i.e., which can be fired at the same time as Cu and Ag. More specifically, a glass composite system ceramic raw material powder comprising a ceramic filler of alumina or the like containing amorphous glass or crystallized glass as an auxiliary, a crystallized glass system ceramic raw material powder which produces a crystal such as cordierite or the like, or a non-glass system ceramic raw material powder which produces glass serving as an auxiliary in the firing cycle can be used. Also, conventional known agents can be respectively used as the organic binder, the plasticizer, the solvent, etc. can be used, and additives such as a dispersant and the like can be further added.

Next, a sintering-resistant powder (for example, alumina powder, zirconia powder or the like) which is less sintered at the sintering temperature of the low-temperature sintering ceramic raw material powder, particularly, 1000° C. or less, and a softening fluid powder (for example, borosilicate glass or the like) which can permeate and diffuse into the spaces between the particles of the sintering-resistant powder, etc. are mixed to prepare a shrinkage-inhibiting layer slurry. The thus-prepared shrinkage-inhibiting layer slurry is coated on the ceramic green sheet (base layer) formed on the carrier film to form a coated film serving as a shrinkage-inhibiting layer. In preparing the shrinkage-inhibiting layer slurry, an organic binder such as polyvinyl butyral or the like, a plasticizer such as di-n-butyl phthalate or the like, and a solvent such as toluene, isopropyl alcohol or the like may be added and mixed.

Then, fine holes for via holes are formed in the base layer and the shrinkage-inhibiting layer formed on the carrier film by punching or laser processing as the occasion demands. The fine holes are filled with a conductor paste or conductor powder to form the via holes. Also, conductor paste is printed to form an electrode pattern which constitutes elements such as a capacitor, an inductor and the like, or an internal conductor pattern serving as a wiring pattern for connecting elements, and a surface conductor pattern for forming external terminals, lands and the like.

The internal conductor pattern can be appropriately formed at various positions such as positions between the carrier film and the base layer and between the base layer and the shrinkage-inhibiting layer, a point on the shrinkage-inhibiting layer, etc. Alternatively, the shrinkage-inhibiting layer may be first formed on the carrier film and then the base layer may be formed. Each of the conductor patterns can be formed by using a metal foil, a metal wire or the like. For example, a punched copper foil may be heat-pressed on the base layer or the shrinkage-inhibiting layer, or a thin film formed by sputtering or plating on a film may be patterned by etching or the like, and then heat-transferred.

The conductor paste for filling the fine holes for the via holes, and the conductor paste for forming various patterns can be obtained by adding a predetermined amount of organic vehicle to a conductor powder composed of a metal such as Ag, Au, Cu, Ni, Ag/Pt, Ag/Pd or the like as a main component, and then stirring and kneading the resultant mixture by a kneader, three rolls or the like. Although the average particle diameter and particle shape of the conductor powder are not limited, the conductor power preferably has an average particle diameter of about 0.3 µm to 10 µm without containing a coarse powder and agglomerated powder.

The organic vehicle contains a binder resin such as ethyl cellulose, acrylic resin, polyvinyl butyral, methacrylate resin or the like, and a solvent such as terpineol, butyl carbitol, butyl carbitol acetate, alcohol or the like as main components, but the vehicle may further contain additives such as a dispersant, a plasticizer, an activator, etc. according to requirements. The viscosity of the paste is preferably set to about 50 to 300 Ps·s from the viewpoint of screen printability or the like.

Particularly, the conductor paste for filling the fine holes for the via holes may contain about 70% by weight or less of glass frit or ceramic raw material powder for achieving matching of sintering shrinkage with the base layer. The composition ratio of the conductor paste can be appropriately selected from various compositions in order to attain matching of the rate of shrinkage with the base layers, adjust resistivity, adhesive strength to the base layers, etc.

Figure 2:
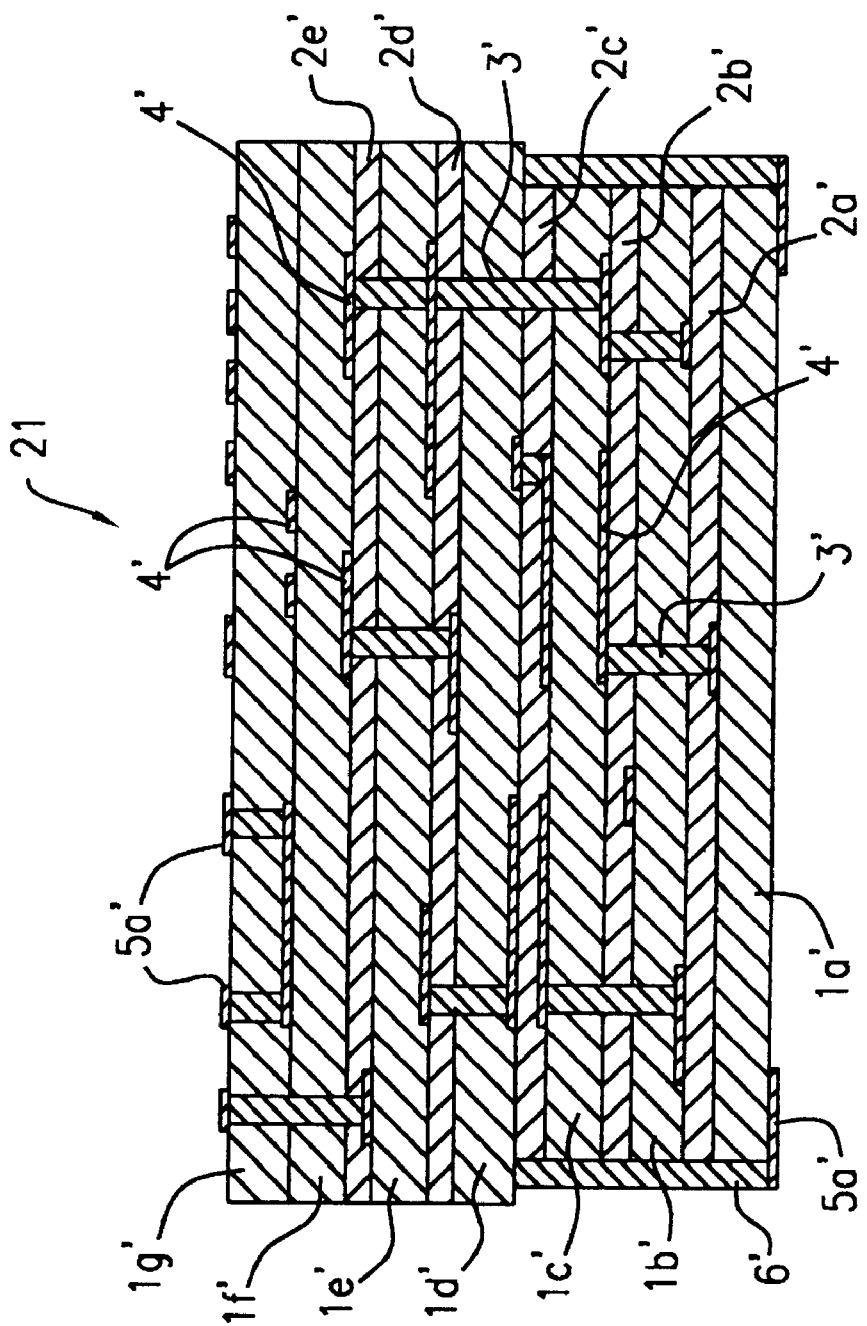
FIG. 2 is a schematic sectional view of a green ceramic laminate according to the present invention.

Then, the base layer and the shrinkage-inhibiting layer formed as described above are separated from the carrier film, and if required, the base layer and the shrinkage-inhibiting layer are laminated in turn together with other ceramic green sheets, followed by pressure-bonding at a predetermined temperature and pressure to form the green ceramic laminate 21 shown in FIG. 2.

The green ceramic laminate 21 has a laminated structure in which green base layers 1a', 1b', 1c', 1d', 1e', 1f' and 1g', which are mainly composed of the low-temperature sintering ceramic raw material powder and the organic binder, and green shrinkage-inhibiting layers 2a', 2b', 2c', 2d' and 2e', which are mainly composed of the sintering-resistant powder, the softening fluid powder and the organic binder, are laminated in turn. Also, green via holes 3' and internal conductor patterns 4' are formed in the green ceramic laminate 21, and a surface conductor pattern 5a' for forming lands, a surface conductor pattern 5b' for forming an external terminal, and a surface conductor pattern 6' for forming an external terminal are further formed on one of the main surfaces, the other main surface, and the side, respectively. The green ceramic laminate 21 shown in FIG. 2 may be a part of a green assembled substrate.

The green ceramic laminate 21 is subjected to a binder eliminating treatment for evaporating the organic binder in air or a reducing atmosphere, and then fired at the sintering temperature (particularly, 1000° C. or less) of the low-temperature sintering ceramic raw material powder. In the firing cycle, the base layers, i.e., the lower-temperature-sintering raw material powder in the base layers, starts to shrink at the initial stage. At this time, the sintering-resistant powder in the shrinkage-inhibiting layers does not start to shrink, and the viscosity of the softening fluid powder in the shrinkage-inhibiting layer does not decrease to a level in which it functions as the sintering auxiliary for the sintering-resistant powder. Therefore, the base layers are respectively subjected to a force of constraint by the shrinkage-inhibiting layers to prevent shrinkage in the planar direction and progress shrinkage only in the thickness direction.

After sintering of the base layers sufficiently proceeds, the softening fluid powder in the shrinkage-inhibiting layers starts to soften and flow at the latter stage of the firing cycle, and permeates into the spaces between the particles of the sintering resistant powder. The shrinkage-inhibiting layers are changed from a porous state to a dense state.

In other words, during the firing cycle, the base layers 1a', 1b', 1c', 1d', 1e', 1f' and 1g' of the green ceramic laminate 21 are sintered, and the shrinkage-inhibiting layers 2a', 2b', 2c', 2d' and 2e' are densified mainly due to softening and flowing of the softening fluid powder. Also, the base layers are respectively subjected to a force of constraint of the shrinkage-inhibiting layers, and thus firing shrinkage proceeds in the thickness direction with substantially no firing shrinkage in the planar direction of the green ceramic laminate 21. Therefore, it is possible to obtain a sintered body, i.e., a multilayered ceramic substrate, having high dimensional precision in the planar direction and high precision. The sintered body may be an assembled substrate containing a plurality of multilayered ceramic substrates obtained after division.

Then, the sintered body (assembled substrate) is divided according to demand to obtain the multilayered ceramic substrate 1 shown in FIG. 1. Furthermore, various mounted components such as semiconductor devices 7 and 8, chip capacitors 9, etc. are mounted on one of the main surfaces of the multilayered ceramic substrate 1 to complete the ceramic multilayer module 11 shown in FIG. 1. These mounted components may be mounted in the state of the assembled substrate. Since the multilayered ceramic substrate 1 has high dimension precision and high reliability, a high-function, small and lightweight ceramic multilayer module can be realized. The ceramic multilayer module can be used as, for example, a radio-frequency module such as a front engine module of a mobile radio communication apparatus or the like.

Although the preferred embodiment of the present invention is described above, the present invention is not limited to the embodiment.

For example, the ceramic raw material powder which constitutes the base layers is not limited to an insulator material, and a dielectric material and a magnetic material may be contained. Also, the thickness of each of the base layers can be arbitrarily selected. Furthermore, the sintering-resistant powder in the shrinkage-inhibiting layers is not limited to an insulator material such as alumina or the like, and any material, for example, a dielectric material such as barium titanate, a magnetic material such as ferrite or the like, may be used as long as the material is substantially not sintered at the sintering temperature of the base layers, and exhibits sufficient force of constraint for the base layers. The uppermost layer and lowermost layer of the green ceramic laminate may not be the base layers. Namely, when the uppermost and lowermost layers of the green ceramic laminate are the shrinkage-inhibiting layers, the flexural strength of the obtained multilayered ceramic substrate can be improved.

The multilayered ceramic substrate of the present invention may be a ceramic multilayer module on which passive components such as chip capacitors, chip LC filters and the like are mounted, and can be applied to multilayer wiring substrates such as a wiring substrate for a multi-chip module, a wiring substrate for hybrid IC and the like. Also, the multilayered ceramic substrate of the present invention can be applied to monolithic ceramic electronic parts such as a monolithic capacitor, a multilayer LC filter and the like.

The present invention is further described with reference to examples.

EXAMPLES

First, predetermined amounts of polyvinyl butyral, di-n-butyl phthalate, toluene and isopropyl alcohol were added to a non-glass type low-temperature sintering ceramic raw material powder containing BaO, $SiO_2$, $Al_2O_3$, CaO and $B_2O_3$ at a predetermined ratio to prepare a base layer slurry composition. The thus-prepared slurry composition was formed in a sheet on a carrier film by the doctor blade method so that the thickness after sintering was the value shown in Table 1, and then dried to form a base layer (ceramic green sheet).

Next, a softening fluid powder of each of the types shown in Table 1 having the temperature at which viscosity was about $10^{6.7}$ Pa·S or less and the average particle diameter shown in Table 1 was mixed with a sintering resistant powder of each of the types shown in Table 1 having the sintering temperature shown in Table 1 so that the content was the value shown in Table 1. Furthermore, polyvinyl butyral, di-n-butyl phthalate, toluene and isopropyl alcohol were added to the resultant mixture to prepare a slurry composition for shrinkage-inhibiting layers. Then, the thus-prepared slurry composition was coated on the surface of the sheet-shaped base layer on the carrier film so that the thickness after sintering was the value shown in Table 1, and dried at a predetermined temperature to form a shrinkage-inhibiting layer on the sheet-shaped base layer.

The base layer and the shrinkage-inhibiting layer were separated from the carrier film, and alternately laminated so that the total thickness after firing was 1 mm, and then heat-bonded at a temperature of 80° C. and a pressure of 200 kg/cm² to obtain a green ceramic laminate. In this example, the base layers were formed to have the same thickness, and each of the base layers and the shrinkage-inhibiting layers was cut to an area of 4 square inches.

Then, the thus-obtained green ceramic laminate was heated in air at 500° C. for 2 hours to evaporate the organic binder contained in the base layers and the shrinkage-inhibiting layers, and then fired at 900° C. for 1 hour to obtain a multilayered ceramic substrate of each of Examples 1 to 23 shown in Table 1.

The rate of shrinkage and the sintered state of each of the multilayered ceramic substrates of Examples 1 to 23 were measured. The results are also shown in Table 1.

TABLE 1

| | | Shrinkage inhibiting layer | | | | | | | |
|---|---|---|---|---|---|---|---|---|---|
| | | Sintering-resistant powder | | Softening fluid powder | | | | | |
| Example | Thickness of base layer (μm) | Type | Sintering temperature (° C.) | Type | Temperature (° C.) | Average particle diameter (μm) | Content (vol %) | Thickness (μm) | Rate of shrinkage (%) | Sintered state |
| 1 | 150 | $Al_2O_3$ | 1500 | — | — | — | — | No | 86 | ○ |
| 2 | 50 | $Al_2O_3$ | 1500 | — | — | — | — | 0.5 | 93 | ○ |
| 3 | 50 | $Al_2O_3$ | 1500 | — | — | — | — | 5 | 97 | X |
| 4 | 150 | $Al_2O_3$ | 1500 | — | — | — | — | 0.5 | 86 | ○ |
| 5 | 150 | $Al_2O_3$ | 1500 | — | — | — | — | 5 | 94 | ○ |
| 6 | 150 | $Al_2O_3$ | 1500 | — | — | — | — | 15 | 99 | X |
| 7 | 300 | $Al_2O_3$ | 1500 | — | — | — | — | 30 | 99 | X |
| 8 | 150 | $Al_2O_3$ | 1500 | A | 780 | 1.5 | 5 | 15 | 96 | ○ |
| 9 | 150 | $Al_2O_3$ | 1500 | A | 780 | 1.5 | 35 | 15 | 97 | ○ |
| 10 | 150 | $Al_2O_3$ | 1500 | A | 780 | 1.5 | 60 | 15 | 96 | ○ |
| 11 | 150 | $Al_2O_3$ | 1500 | A | 780 | 1.5 | 70 | 15 | 95 | ○ |
| 12 | 150 | $Al_2O_3$ | 1500 | A | 780 | 1.5 | 35 | 50 | 98 | ○ |
| 13 | 150 | $Al_2O_3$ | 1500 | A | 780 | 7 | 35 | 15 | 97 | ○ |
| 14 | 150 | $Al_2O_3$ | 1500 | A | 780 | 1.5 | 35 | 15 | 95 | ○ |
| 15 | 300 | $Al_2O_3$ | 1500 | A | 780 | 1.5 | 35 | 30 | 97 | ○ |
| 16 | 150 | $Al_2O_3$ | 1500 | B | 630 | 1.5 | 35 | 15 | 97 | ○ |
| 17 | 150 | $Al_2O_3$ | 1500 | C | 760 | 1.5 | 35 | 15 | 98 | ○ |
| 18 | 150 | $Al_2O_3$ | 1500 | D | 880 | 1.5 | 35 | 15 | 98 | ○ |
| 19 | 150 | $Al_2O_3$ | 1500 | E | 1050 | 1.5 | 35 | 15 | 99 | Δ |
| 20 | 150 | $Al_2O_3$ | 1500 | F | 680 | 1.5 | 35 | 15 | 97 | ○ |
| 21 | 150 | $Al_2O_3$ | 1500 | G | 850 | 1.2 | 35 | 15 | 98 | ○ |
| 22 | 150 | $ZrO_2$ | 1500 | D | 880 | 1.5 | 20 | 50 | 98 | ○ |
| 23 | 150 | $BaTiO_3$ | 1300 | D | 880 | 1.5 | 20 | 50 | 97 | ○ |

In the "Type" column of the softening fluid powder in Table 1, "A" represents a $SiO_2$—$B_2O_3$—BaO system amorphous glass powder ($SiO_2$:$B_2O_3$:BaO=34:18:38 ratio by weight), "B" represents a $SiO_2$—$B_2O_3$—BaO system amorphous glass powder ($SiO_2$:$B_2O_3$:BaO=13:45:44 ratio by weight), "C" represents a $SiO_2$—$B_2O_3$—$K_2O$ system amorphous glass powder ($SiO_2$:$B_2O_3$:$K_2O$=77:20:3 ratio by weight), "D" represents a $SiO_2$—$B_2O_3$—BaO system amorphous glass powder ($SiO_2$:$B_2O_3$:BaO=38:12:50 ratio by weight), "E" represents a $SiO_2$—$B_2O_3$—CaO—$Al_2O_3$ system amorphous glass powder ($SiO_2$:$B_2O_3$:CaO:$Al_2O_3$=30:32:32:6 ratio by weight), "F" represents a $SiO_2$—$B_2O_3$—CaO—$Li_2O$ system crystallized glass powder ($SiO_2$:$B_2O_3$:CaO:$Li_2O$=30:30:36:4 ratio by weight), and "G" represents a mixed oxide powder containing BaO and $B_2O_3$ (BaO:$B_2O_3$=40:60 ratio by weight).

The "Temperature" column sets forth the temperature at which the viscosity becomes about $10^{6.7}$ Pas or except for "850" value of Example 21 which represents the temperature at which the mixed oxide powder containing BaO and $B_2O_3$ starts to melt.

Furthermore, "Rate of shrinkage" represents the area ratio of the main surfaces of the multilayered ceramic substrate after firing to the area of the main surfaces of the green ceramic laminate. In the column "Sintered state", the mark "○" represents that the shrinkage-inhibiting layer is extremely densified, the mark "Δ" represents that the shrinkage-inhibiting layer is sufficiently densified, and the mark "×" represents that the shrinkage-inhibiting layer is not sufficiently densified.

Table 1 indicates that in each of the multilayered ceramic substrates of Examples 8 to 23, the shrinkage-inhibiting layer adjacent to the base layer contains the softening fluid powder softening and flowing to permeate into the spaces between the particles of the porous sintering-resistant powder without decreasing the force of constraint, thereby achieving a rate of shrinkage of 95% or more and sufficiently densifying the shrinkage-inhibiting layer.

When the shrinkage-inhibiting layer adjacent to the base layer contains the softening fluid powder and thus the amount of the glass component contained in the base layer or the glass component produced by firing is very small, or when the shrinkage-inhibiting layer is relatively thick, the firing shrinkage in the planar direction of a substrate can be suppressed and the shrinkage-inhibiting layer can be sufficiently densified to produce a multilayered ceramic substrate with high precision and high reliability.

The method of manufacturing a multilayered ceramic substrate of the present invention comprises laminating a base layer composed of a ceramic raw material powder as a main component, and a shrinkage-inhibiting layer composed of a sintering-resistant powder which is not sintered at the sintering temperature of the ceramic raw material powder as a main component to obtain a laminate, and then firing the laminate at the sintering temperature of the ceramic raw material powder. In the manufacturing method, the shrinkage-inhibiting layer contains a softening fluid powder which can densify the shrinkage-inhibiting layer due to softening and flowing during firing. Therefore, particularly when the shrinkage-inhibiting layer is thick or when the base layer contains a small amount of glass component, the firing shrinkage in the planar direction of the substrate can be suppressed, and at the same time, the shrinkage-inhibiting layer can be sufficiently densified to obtain a multilayered ceramic substrate with high precision and high reliability.

What is claimed is:

1. A method of manufacturing a multilayered ceramic substrate comprising:

providing a laminate comprising at least one base layer comprising a ceramic raw material powder and at least one shrinkage-inhibiting layer comprising a powder which is substantially does not sinter at the sintering temperature of the ceramic raw material powder and a softening powder which becomes a fluid at the sintering temperature of the ceramic raw material powder so as to densify the shrinkage-inhibiting layer due to softening and flowing before sintering is complete, the base and shrinkage-inhibiting layers being green layers; and firing the resultant laminate at the sintering temperature of the ceramic raw material powder.

2. The method of manufacturing a multilayered ceramic substrate according to claim 1, wherein the softening powder is characterized by having a viscosity of about $10^{6.7}$ Pa·s or less at the maximum firing temperature achieved during the firing.

3. The method of manufacturing a multilayered ceramic substrate according to claim 2, wherein the content of the softening powder is about 60% by volume or less of the shrinkage-inhibiting layer.

4. The method of manufacturing a multilayered ceramic substrate according to claim 3, wherein the softening powder comprises an oxide which produces a liquid phase at the firing temperature.

5. The method of manufacturing a multilayered ceramic substrate according to claim 3, wherein the softening powder comprises a glass powder containing at least one inorganic oxide selected from $SiO_2$, $B_2O_3$, $GeO_2$, $ZrO_2$, $Al_2O_3$, $P_2O_3$ and $V_2O_3$.

6. The method of manufacturing a multilayered ceramic substrate according to claim 5, wherein the softening fluid powder has an average particle diameter of about 5 μm or less.

7. The method of manufacturing a multilayered ceramic substrate according to claim 1, wherein the base layer is thicker than the shrinkage-inhibiting layer, and the shrinkage-inhibiting layer has a thickness of about 0.5 to 50 μm.

8. The method of manufacturing a multilayered ceramic substrate according to claim 7, wherein the thickness of the base layer is equal to or more than three times of that of the shrinkage-inhibiting layer.

9. The method of manufacturing a multilayered ceramic substrate according to claim 1, wherein the ceramic raw material powder comprises a low-temperature sintering ceramic raw material powder.

10. The method of manufacturing a multilayered ceramic substrate according to claim 9, wherein the low-temperature sintering ceramic raw material powder is a glass free low-temperature sintering ceramic raw material powder.

11. The method of manufacturing a multilayered ceramic substrate according to claim 1, wherein least one of the base layer and the shrinkage-inhibiting layer has a via hole or a conductor pattern or both.

12. The method of manufacturing a multilayered ceramic substrate according to claim 11, wherein the via hole and the conductor pattern comprise a metal or an alloy comprising at least one element selected from the group consisting Ag, Au, Cu, Pd, W and Ni.

13. The method of manufacturing a multilayered ceramic substrate according to claim 1, further comprising mounting at least one electrical component on an exterior surface of the laminate after firing of the laminate.

* * * * *